(12) United States Patent
Srinivasan et al.

(10) Patent No.: US 7,768,350 B2
(45) Date of Patent: Aug. 3, 2010

(54) OUTPUT GAIN STAGE FOR A POWER AMPLIFIER

(75) Inventors: Vishnu Srinivasan, Austin, TX (US); David E. Bockelman, Dripping Springs, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 0 days.

(21) Appl. No.: 12/317,819

(22) Filed: Dec. 30, 2008

(65) Prior Publication Data

US 2010/0164621 A1 Jul. 1, 2010

(51) Int. Cl.
*H03F 3/45* (2006.01)

(52) U.S. Cl. .................. 330/253; 330/258; 330/276; 330/195

(58) Field of Classification Search .............. 330/253, 330/258, 276, 195
See application file for complete search history.

(56) References Cited

U.S. PATENT DOCUMENTS

| | | | |
|---|---|---|---|
| 4,580,111 A * | 4/1986 | Swanson | 332/152 |
| 4,593,251 A | 6/1986 | Smith | |
| 4,680,559 A | 7/1987 | Swanson | |
| 4,703,283 A * | 10/1987 | Samuels | 330/9 |
| 5,264,810 A | 11/1993 | Sager | |
| 5,570,062 A | 10/1996 | Dent | |
| 5,872,481 A | 2/1999 | Sevic et al. | |
| 5,930,128 A | 7/1999 | Dent | |
| 6,069,525 A | 5/2000 | Sevic et al. | |
| 6,294,955 B1 | 9/2001 | Luu et al. | |
| 6,731,166 B1 | 5/2004 | Sabouri et al. | |
| 6,996,379 B2 | 2/2006 | Khorram | |
| 7,079,818 B2 | 7/2006 | Khorram | |
| 7,095,283 B2 | 8/2006 | Kee et al. | 330/295 |
| 7,129,784 B2 | 10/2006 | Bhatti et al. | |
| 7,157,965 B1 | 1/2007 | Kim | |
| 7,161,427 B2 * | 1/2007 | Westwick et al. | 330/165 |
| 7,215,206 B2 | 5/2007 | Dupuis et al. | 330/311 |
| 7,365,602 B2 | 4/2008 | Bhatti et al. | |
| 7,460,604 B2 * | 12/2008 | Dupuis | 375/258 |
| 7,461,281 B2 * | 12/2008 | Miyazaki | 713/323 |
| 2005/0189995 A1 | 9/2005 | Kee et al. | |

(Continued)

FOREIGN PATENT DOCUMENTS

EP 01229642 8/2002

OTHER PUBLICATIONS

U.S. Appl. No. 12/151,199, filed May 5, 2008, Entitled "Controlling Power With an Output Network," by Vishnu Srinivasan, et al.

(Continued)

*Primary Examiner*—Patricia Nguyen
(74) *Attorney, Agent, or Firm*—Trop, Pruner & Hu, P.C.

(57) ABSTRACT

In one embodiment, the present invention includes multiple gain stages to receive and amplify a differential input signal at different common mode voltages. The stages each may include a pair of linear NMOS gain transistors coupled to a primary coil of a given output transformer. One of the stages may include commonly coupled terminals coupled to a center tap of the primary coil of an output transformer of another stage, and a supply current provided to one of the stages is re-used for the other stage(s).

25 Claims, 9 Drawing Sheets

U.S. PATENT DOCUMENTS

2007/0096831 A1     5/2007    Gao et al.
2009/0273397 A1*   11/2009   Bockelman et al. ........... 330/51

OTHER PUBLICATIONS

U.S. Appl. No. 12/151,812, filed May 9, 2008, Entitled "Supply Control for Multiple Power Modes of a Power Amplifier," by Vishnu Srinivasan, et al.

RF Micro Devices, Inc., "RF2173, 3V GSM Power Amplifier, Package Style: QFN, 16-Pin, 4×4," 2006, pp. 1-14.

RF Micro Devices, Inc., "What's Next In UMTS Front-Ends," 2007, pp. 1-2.

Anadigics, "AWT6278R, HELP3™ PCS/WCDMA 3.4 V/29.5 dBm, Linear Power Amplifier Module, Data Sheet—Rev. 2.0," Jan. 2007, pp. 1-8.

U.S. Patent and Trademark Office, First Official Action Mailed Sep. 21, 2009 with Reply to Office Action Filed Dec. 17, 2009 in related U.S. Appl. No. 12/151,199.

PCT/US2009/036480 International Search Report dated Sep. 28, 2009.

U.S. Patent and Trademark Office, Notice of Allowance issued on Jan. 11, 2010, in U.S. Appl. No. 12/151,199.

\* cited by examiner

US 7,768,350 B2

OUTPUT GAIN STAGE FOR A POWER AMPLIFIER

BACKGROUND

Power amplifiers (PAs) are commonly used in wireless devices to amplify a signal for transmission. PAs are typically formed of multiple stages, and often include a final gain stage, commonly referred to as an output gain stage, to amplify the signal to a desired power level for its output to a load such as an antenna that radiates the amplified signal.

Wireless communication systems dictate the amount of power to be output. Different requirements may exist in different communication protocols. Many communication systems have various requirements for a handset to achieve with relation to power, efficiency, and linearity over varying signal levels. For example, a variety of communication systems, including enhanced data rates for GSM evolution (EDGE), long term evolution (LTE/4 G), WiFi in accordance with an IEEE 802.11 standard, worldwide interoperability for microwave access (WiMax), code division multiple access (CDMA), and wideband-code division multiple access (W-CDMA) all have varying requests. For example, a W-CDMA band 1 (B1) PA should be able to output approximately 30 dBm of power at an efficiency better than 40% and at a linearity of better than −40 dBc of adjacent channel leakage ratio (ACLR).

Many of the mainstream linear PAs today utilize bipolar transistors in fabrication processes such as a gallium arsenide (GaAs) process which offers high unity-current-gain frequency ($f_t$) gain devices (bipolar transistors). However, other PAs implement the PA using a complementary metal oxide semiconductor (CMOS) process. In such systems, the output gain stage typically formed of CMOS devices, including both NMOS and PMOS output transistors. In CMOS processes, a PMOS device is typically slower (lower ft) than the corresponding NMOS device, and hence, is much larger than a corresponding (i.e., same relative transconductance) NMOS device, e.g., approximately 2-3× larger. Such larger PMOS transistors are needed to form a true complementary gain-stage to meet the requirements of different protocols. As a result, a significant amount of area is consumed by the PMOS devices and a correspondingly large parasitic capacitance is created. In turn, this requires a relatively small inductance to resonate out this capacitance, which can be difficult to fabricate. Furthermore, the larger PMOS devices present a larger non-linear gate capacitance that can adversely affect linearity of the PA.

SUMMARY OF THE INVENTION

One aspect of the present invention is directed to an apparatus that includes multiple gain stages, e.g., at least two differential gain stages to receive and amplify a differential input signal at different common mode voltages. The stages each may include a pair of linear NMOS gain transistors having drain terminals coupled to a primary coil of a given output transformer. One of the stages may include commonly coupled source terminals coupled to a center tap of the primary coil of an output transformer of another stage, and a supply current provided to one of the stages is re-used for the other stage(s).

Yet another aspect of the present invention is directed to a power amplifier that has an output gain stage formed of an all-NMOS configuration, including at least two linear NMOS gain transistors differentially driven by a differential input signal. The transistors may have corresponding terminals coupled to an output transformer to output a selected power level to a load. Such an output gain stage has a substantially smaller capacitance than a CMOS output gain stage including one or more PMOS transistors.

A still further aspect is directed to a method for receiving an input signal from a power amplifier gain stage, amplifying the signal in an all-NMOS gain stage using a single supply current re-used for at least two gain stage portions of the gain stage connected in a series configuration with regard to the single supply current, and outputting the amplified signal to a load via an output transformer network of the power amplifier. In one such embodiment, the gain stage portions can be biased at different common mode voltages.

Yet another aspect of the present invention is directed to an apparatus that includes multiple NMOS output gain stages to receive a differential input signal at different common mode voltages. In addition, multiple transformers may be coupled to the stages. One transformer may be coupled to one of the stages to output a first differential output signal to an output load and may have a center tap coupled to receive a supply current at a supply voltage node, and a second transformer may be coupled to another of the stages to output a second differential output signal to the output load, and may have a center tap coupled to receive an intermediate supply current re-used from the supply current at an intermediate supply voltage node.

Some embodiments may be integrated into a wireless device that includes a transceiver to receive baseband signal information from a baseband processor and to output a radio frequency (RF) signal, a power amplifier such as described herein, and an antenna coupled to the power amplifier to radiate the amplified RF signal.

DETAILED DESCRIPTION

Embodiments may provide an output gain stage that is formed without PMOS devices. That is, an output gain stage for a PA implemented in a CMOS process technology (instead of a GaAs process technology), can be formed using only NMOS gain devices such as NMOS transconductors. As used herein, the term "CMOS PA" refers to such a PA that is formed via a CMOS process. As will be described below, such a PA may include multiple gain stages and/or driver stages formed using both PMOS and NMOS devices. However, in various embodiments, at least an output gain stage may be formed using only NMOS devices. Because of the size difference between NMOS and PMOS devices, replacing the PMOS devices with higher ft NMOS devices leads to a reduced area for the transistors and a corresponding reduction in total effective capacitance, i.e., parasitic capacitance. Further, by reducing parasitic capacitance, the non-linear effects caused by the parasitic capacitance are also reduced, easing implementation of a linearization circuit to compensate for such non-linearities. As will be discussed further below, by controlling various parameters of an output stage, a stage using only NMOS transistors can be realized to provide the same power output as a corresponding CMOS stage, with reduced capacitance and linearization issues.

Figure 1:
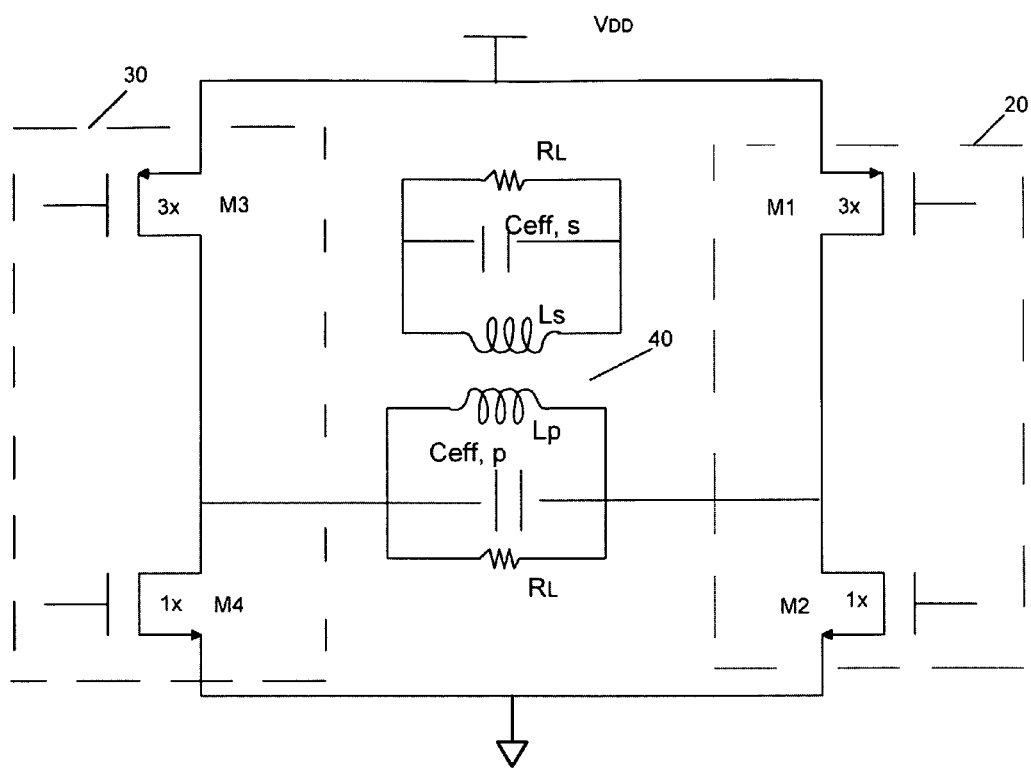
FIG. 1 is a schematic diagram of a CMOS output gain stage.

Referring now to FIG. 1, shown is a schematic diagram of a CMOS output gain stage. As shown in FIG. 1, gain stage 10 includes a pair of gain stages, namely a first CMOS stage 20 and a second CMOS stage 30. As shown, each CMOS stage includes a pair of complementary MOSFETS, namely M1 and M2, and M3 and M4, respectively. CMOS output stage 10 acts in a push-pull manner, switching the output of the primary coil (Lp) of an output transformer 40 by 0 to Vdd (or Vreg) volts on each side. The common mode (CM) voltage on the primary side coil (Lp) of transformer 40 is $$\frac{Vdd}{2}.$$

As shown in FIG. 1, the outputs of CMOS stages 20 and 30 may be coupled to output transformer 40 that in turn is coupled to a load $R_L$, e.g., a son load. Load $R_L$ is transformed to a lower impedance by output network transformer 40. Note also the presence of deliberate and parasitic capacitances, lumped as $C_{eff,p}$, and $C_{eff,s}$ coupled in parallel with the primary and secondary coils $L_p$ and $L_s$ of output transformer 40. These capacitances, along with Lp and Ls are used to tune the output network to the band of operation, such as the W-CDMA band-1 center frequencies of 1950 MHz.

As further shown in FIG. 1, the commonly coupled source terminals of NMOS transistors M2 and M4 are coupled to a reference voltage, e.g., a ground voltage, while the source terminals of PMOS transistors M1 and M3 are commonly coupled to a supply voltage $V_{DD}$, which in one embodiment may be 3.4 volts. This supply voltage may be provided by an internal or external regulator which would connect to a battery. While not shown for ease of illustration, understand that transistors M1-M4 are driven at their corresponding gate terminal by an incoming differential signal (e.g., the positive portion of which is provided to first CMOS stage 20, and the negative portion of which is provided to second CMOS stage 30) which may be received from an intermediate gain stage of the PA. In gain stage 10, PMOS transistors M1 and M3 may be sized at approximately 2.5×–3.5× (shown as 3× in FIG. 1) of the NMOS transistor size (i.e., for a given current its transductance (gm) is lower than a comparable NMOS device by that amount). The exact ratio is determined by the input voltage scaling of the PMOS (relative to the NMOS) and the specifics of the MOS transistors in the process technology node, which is used to build the PA, such as CMOS 0.35 um, 0.25 um, 0.18 um, or 0.13 um.

The primary coil Lp of output transformer 40 resonates with the effective capacitance $C_{eff,p}$ across it, which is formed of the drain-to-bulk capacitance $C_{db}$, the drain-to-gate capacitance $C_{dg}$, and other associated capacitances relating to the PMOS and NMOS transistors. The unity-current-gain frequency ($f_t$) (related to $$\frac{gm}{C})$$

for the PMOS device is lower than the NMOS $f_t$ by approximately 2× to 3×.

There are two main problems associated with the output stage configuration of FIG. 1: (a) the relatively large $C_{eff,p}$, which in some implementations can be on the order of approximately 50 picoFarads (pFs), of the PMOS and NMOS devices that resonates with Lp at a fixed frequency (such as Band 1) causes the Lp to be rather small (e.g., 0.12 nanoHenries (nH)); and (b) the 3× larger PMOS presents a 3× larger (than NMOS) non-linear gate capacitance that affects the linearity. As described above, the PMOS/NMOS devices for certain systems can be sized such that about 29 dBm of power can be delivered at an efficiency better than 40% and linearity better than −40 dBc (ACLR). A linearity compensation circuit to handle the non-linear capacitance is more difficult to implement when this non-linear capacitance is large (due to use of PMOS devices that are up to 3× bigger than corresponding NMOS devices). Together these two issues make the implementation of a linearized CMOS PA output stage very challenging. Further, the input capacitance into the output stage is large as a result of the PMOS device. This makes an inductance value for an input transformer (or other matching network) very small and hard to realize. Thus in various embodiments, these larger PMOS devices may be replaced with NMOS devices, as will be described below. Note that the ability to replace PMOS with NMOS can occur because the load is not physically coupled to the gain stage, but instead is coupled to the secondary coil of the output transformer, thus by providing multiple secondary coils to couple to a single load resistance, the same power can be delivered. The use of transformers for combining powers facilitates this "conversion" of a PMOS gain device to a NMOS gain device by allowing the use of different "gnd" reference voltages.

Figure 2A:
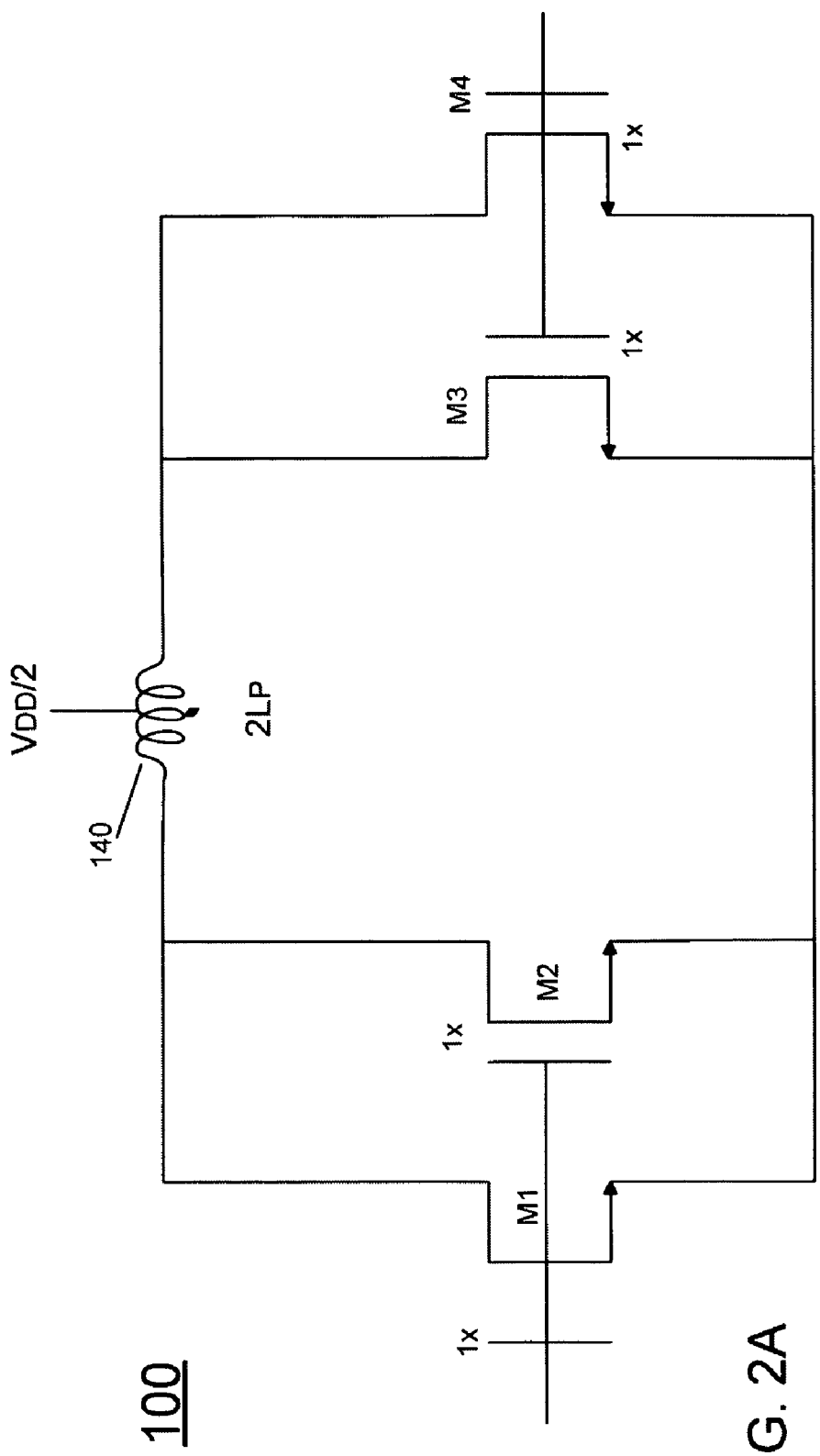
FIG. 2A is a schematic diagram of one implementation of an output stage in accordance with an embodiment of the present invention.

Referring now to FIG. 2A, shown is a schematic diagram of one implementation of an output stage in accordance with an embodiment of the present invention. As shown in FIG. 2A, output stage 100 includes multiple NMOS transistors M1-M4. Parallel-coupled transistors M1 and M2 may be coupled to a first portion of a differential signal (e.g., IN+) while parallel-coupled transistors M3 and M4 may be coupled to a second portion of the differential signal (e.g., IN−). Thus in this implementation, the larger (1×+1×=2×) NMOS transistors provide the transconductance of the PMOS transistor and hence, may replace the PMOS transistors of CMOS stage 10 of FIG. 1. Note that the NMOS transistors are linear gain devices, and do not act as switching devices. Instead, their topology is such that these transistors provide the desired gain for an output signal. Furthermore, note that the NMOS transistors may all be of the same size (e.g., 1×), while in contrast the PMOS transistors that are replaced by the NMOS transistors are of a larger size (e.g., 3×). Further note that to provide the same output power, output transformer 140 may be formed of a larger inductance (e.g., $2L_P$) and the supply voltage applied may be half that of the CMOS stage of FIG. 1 (e.g., $V_{DD}/2$). For ease of illustration, the secondary coil of output transformer 140, as well as the effective capacitance and load resistance is not shown.

However, understand that at least some of these components may be differently sized as compared to the FIG. 1 implementation.

Specifically, as a result of the reduced size of the NMOS transistors as compared to PMOS transistors, the effective capacitance may be substantially smaller than that of CMOS stage 10 of FIG. 1, e.g., $C_{eff,p}/2$. Still further, to maintain the desired output power level, the load may be kept at the same value as before: $R_L$. By replacing the larger PMOS device (which provides a given gm) with a smaller NMOS device (with the same gm), the same gain (voltage or power) is preserved in the NMOS output stage. Also preserved is the same voltage swing on the primary coil (Lp) of output transformer 140. If the impedance ratio is unchanged, then the same power as in CMOS output stage 10 is delivered by the NMOS output stage 100. Note the inductor is doubled to 2 Lp because the effective capacitance is halved, from $C_{eff,p}$ to $C_{eff,p}/2$.

Figure 2B:
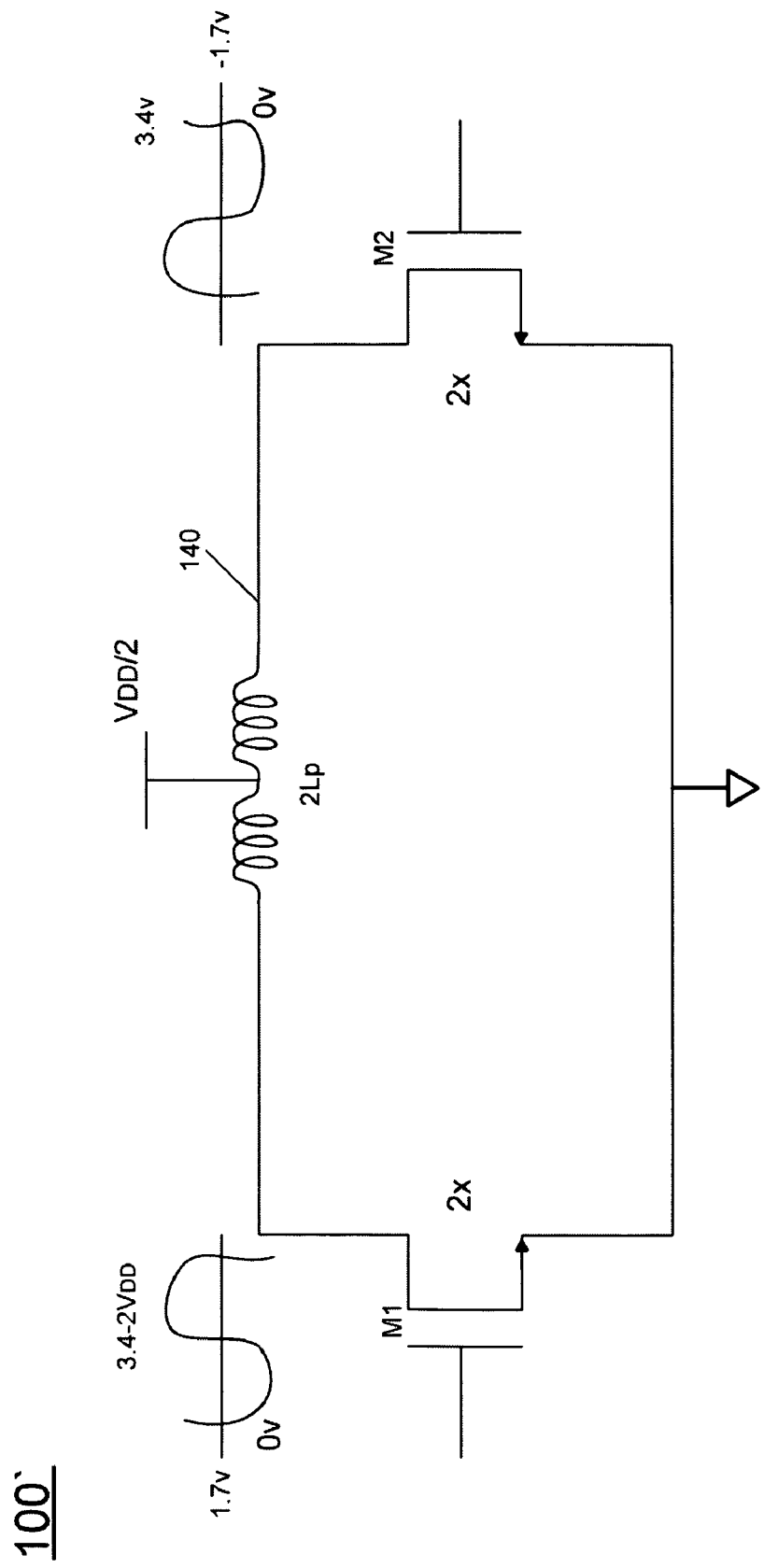
FIG. 2B is a schematic diagram of an alternate output stage in accordance with an embodiment of the present invention.

FIG. 2B shows an alternate schematic diagram of an output stage in accordance with an embodiment of the present invention. As shown in FIG. 2B, in output stage 100', instead of having parallel-coupled transistors, the differential sides of output stage 100' are provided with NMOS transistors M1 and M2 of a larger size, i.e., 2×. Note that the same output swing and common mode voltage are realized. And again, the NMOS transistors are linear gain devices. Thus the same benefits as described as to FIG. 2A are also present in this topology. For example, the capacitance (input or output) relative to the CMOS output stage 10 has been reduced in half. Assuming that CMOS stage 10 has a 4× capacitance value (owing to a 1×NMOS and 3×PMOS), it is reduced down to 2× in the NMOS-only output stage. This is a 50% reduction in capacitance at the gate input, as well as at the output of the gain stage. Because the output capacitance is 50% smaller, the Lp of the output transformer can be 100% bigger, and the input nonlinear capacitor is 50% smaller, the implementation challenges are notably eased. Further, the larger transformer can have an improved Q factor, as the larger sized (e.g., 2×) transformer has less loss than a smaller (e.g., 1×) transformer. This Q factor can be on the order of 50% greater, in some embodiments. Still further, using this transformer a PA design can perform over a wide range of frequencies. For example, the PA can operate at band 1, e.g., 1.92 to 1.98 GHz, and can further operate at even higher frequencies such as 2.5-2.6 GHz (e.g., band 7 operating points).

Because NMOS devices have a slightly larger length and smaller (total) width (than PMOS devices) for a given gm, the effective (large-signal) gds is smaller, and this directly helps in boosting efficiency. The smaller total capacitance (and hence smaller non-linear capacitance) provided (better for linearity) allows more flexibility for linearizing techniques, as described further below.

While implementations such as shown in FIGS. 2A and 2B can significantly reduce effective capacitance and improve linearity while reducing output stage size, the reduced supply voltage of Vdd/2=1.7V may dictate the use of a regulated voltage such as obtained from a DC-DC converter. In some PA systems, such a DC-DC converter can be a relatively large and expensive component, and furthermore is typically implemented off-chip from the PA. Thus in some implementations, an output voltage of $V_{DD}$ (e.g., 3.4/2V=1.7V) may be supplied to the NMOS output stage at a center tap of the primary coil of output transformer 140. If, however, a more conventional regulated supply of Vdd=3.4V were to be used, 2 Vdd (or 6.8V) would be developed at the drain terminal of the NMOS transistors. In a CMOS process using thick oxide NMOS devices (corresponding to CMOS process technology nodes smaller than 0.35 um), this voltage cannot be withstood by the NMOS devices and would break down. Thus higher voltage transistors may be needed. It is to be noted, that while delivering the maximum linear power into an ideal load, the voltage swing at the NMOS drain may be smaller than 2 Vdd. But under a mismatched load condition, this voltage swing could get as large as 2 Vdd To avoid the need for a DC-DC converter with large external components such as inductors, other embodiments may take advantage of the power combining flexibility that a transformer affords.

Figure 3:
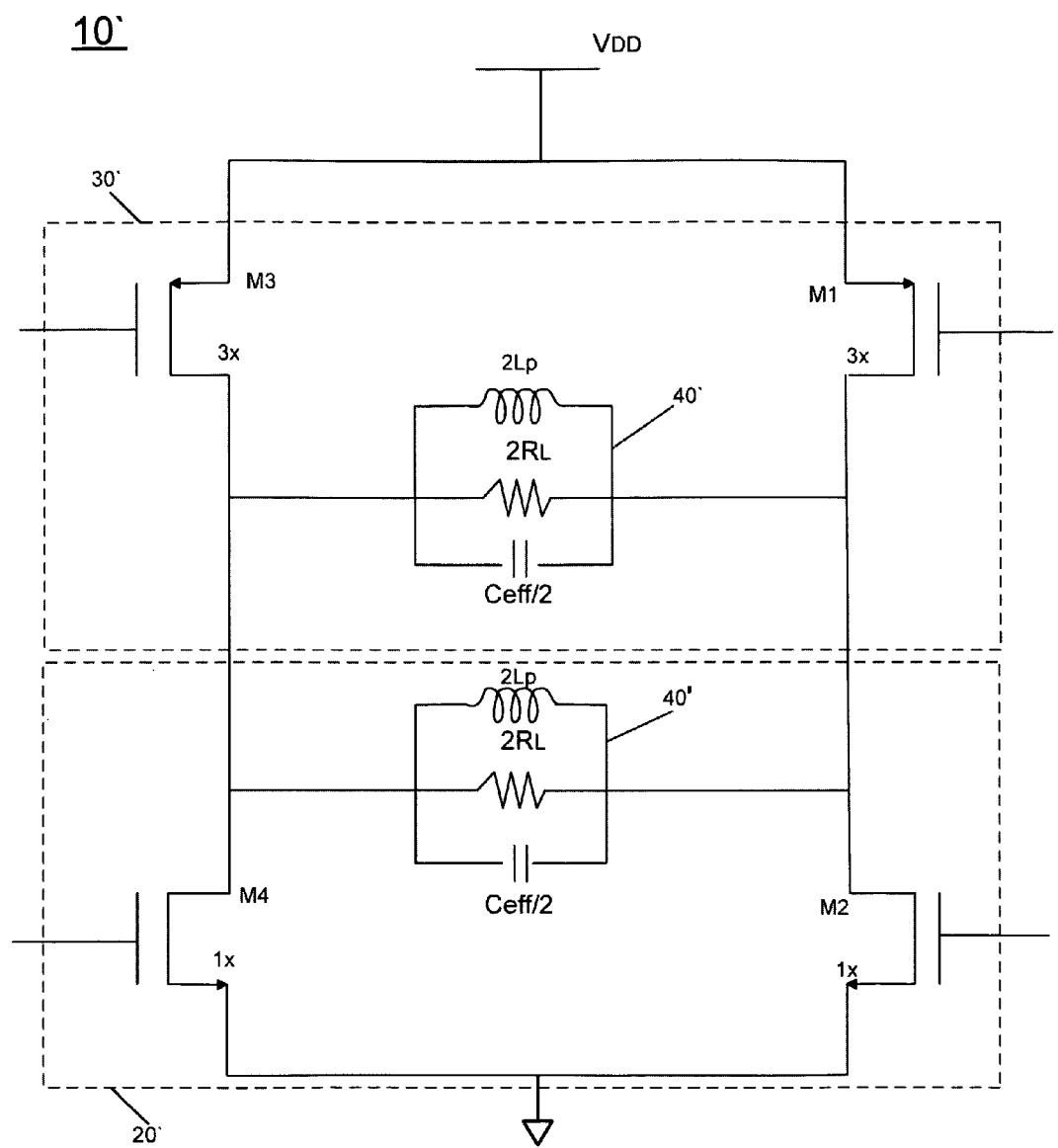
FIG. 3 is a schematic diagram of an alternate view of the CMOS output stage of FIG. 1.

Referring now to FIG. 3, shown is an alternate view of the CMOS output stage of FIG. 1. However, note that in FIG. 3, output stage 10' has been reconfigured such that the output network 40' formed of the primary coil of the output transformer, load and effective capacitance has been separated into 2 equal halves, such that the PMOS devices M1 and M3 are conceptually provided with its own output network, as are the NMOS devices M2 and M4. Specifically, the output network can be reconfigured in this way such that a reduced effective capacitance is realized ($C_{eff}/2$), enabling a larger resonating inductance of the primary coil (2Lp) of the output transformer 40'. Note that while the $C_{eff}/2$ capacitors may be equal, the parasitic capacitance associated with the PMOS devices may be higher than that of the parasitic capacitance associated with the NMOS devices. Note that the parasitic component of $C_{eff}/2$ may be reduced in all NMOS configurations. Furthermore, to ensure the same total output power is delivered, the load resistance is also doubled ($2R_L$). Note in FIG. 3, the secondary coil of the output transformers is not shown for ease of illustration, but are understood to couple between the primary coil and the load. In effect, two parallel versions of the gain stage of FIG. 1 are provided. In these parallel versions 20' and 30', because the capacitance is reduced, e.g., in half, the inductance may be doubled. The resistance is also doubled to ensure that the total power delivered to the load stays the same.

Figure 4A:
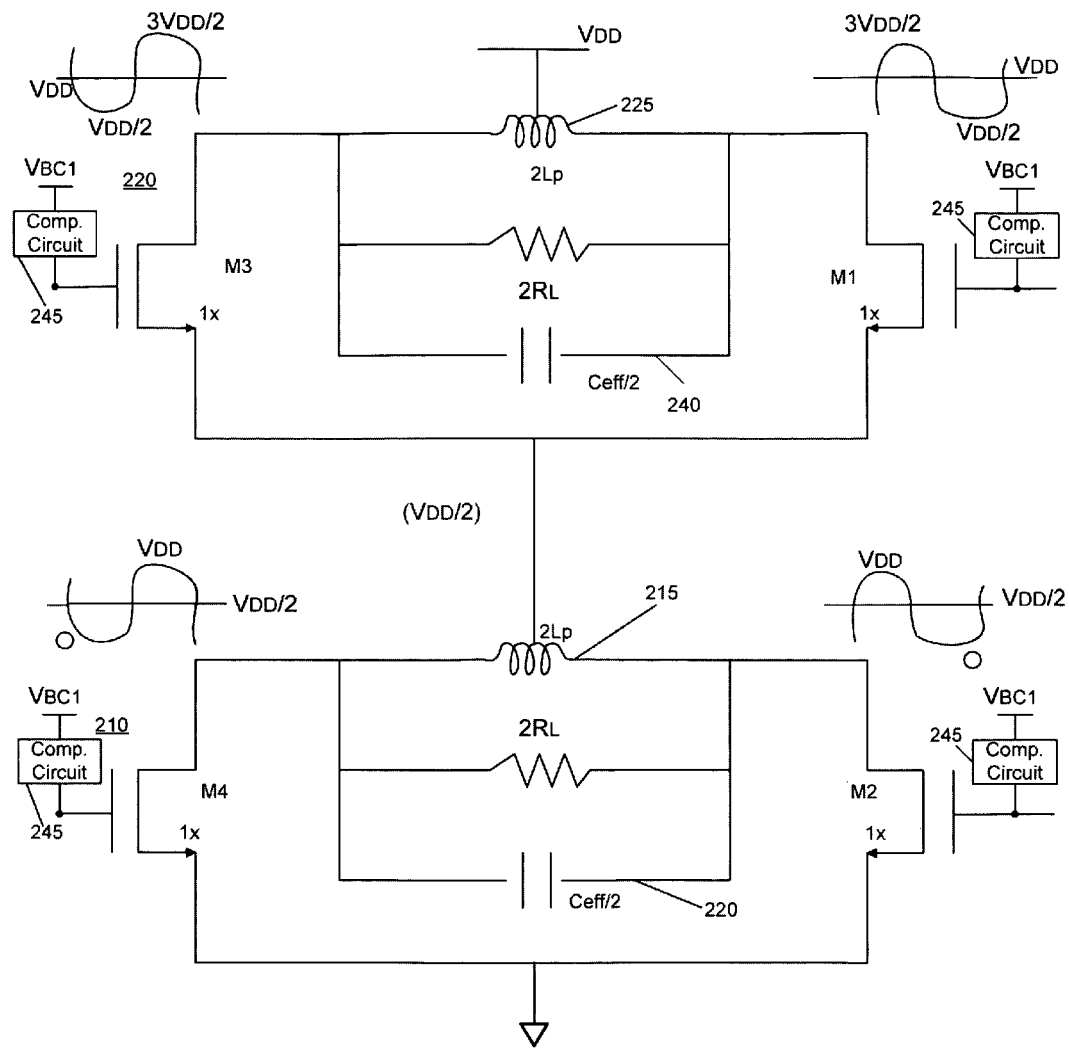
FIG. 4A is a schematic diagram of an output stage configuration in accordance with another embodiment of the present invention.

Extending the implementation of FIG. 3 to an all-NMOS configuration, another embodiment of the present invention can be realized, shown in the schematic diagram of FIG. 4A. Essentially, the gain stage formed by the PMOS transistors, M3 and M1, in FIG. 3 are transformed into its dual configuration of a NMOS gain stage, formed of PMOS transistors M3 and M4. As shown in FIG. 4A, output stage 200 includes a pair of differential output stages 210 and 220 each of which is formed of differentially-connected linear NMOS gain transistors (i.e., M1 and M2 and M3 and M4, respectively). While the scope of the present invention is not limited in this regard, at least NMOS transistors M1 and M3 may be formed using a deep N-well process, as their commonly coupled source terminals are to be at a voltage of $V_{DD}/2$, rather than ground. Note the similar output networks including the primary coils of the output transformers 215 and 225 (secondary coils are not shown), along with the load resistance and effective capacitance. The total parasitic contribution of MOS related capacitance to the total effective capacitance in FIG. 4A is reduced by about 2× as compared to FIG. 3, since, as described above, the parasitic capacitance associated with NMOS devices is less than that of PMOS devices. As such, in some implementations, a higher deliberate capacitance may be provided, or it is possible to reduce the deliberate capacitance to improve performance, or enable operation of the PA at much higher frequencies (such as Band-7 of the W-CDMA standard). Note that the Lp may be increased to accommodate the same output frequency.

Again note as discussed above regarding FIGS. 2A and 2B, NMOS transistors M1 and M3 may be sized the same as NMOS transistors M2 and M4, rather than using much larger-sized PMOS transistors. Furthermore, note that the primary coil of output transformer 225 may be center tapped at a supply voltage node with a supply voltage $V_{DD}$. This $V_{DD}$ may be provided from an on-chip low dropout (LDO) regulator that is formed on the same monolithic die as the remainder of the PA. In this embodiment, there is no longer a need to provide a $V_{DD}/2$ (=1.7V) with a DC-DC converter to avoid high-voltage stress on the MOS transistors (as described with regard to FIGS. 2A and 2B).

In turn, the commonly coupled source terminals of NMOS transistor M3 and M4 are at a voltage level of $V_{DD}/2$, and are coupled to an intermediate voltage node at a center tap of the primary coil of output transformer 215. This voltage node acts as a virtual ground connection, as the voltage level does not vary.

In this way, both gain stages are operated at the proper voltage swing. Specifically, gain stage 210 has a common mode voltage of $V_{DD}/2$ and provides a peak-to-peak signal of $V_{DD}$ (i.e., traveling from zero volts to $V_{DD}$ volts). Similarly, gain stage 220 has a similar voltage swing of $V_{DD}$, with a common mode voltage at $V_{DD}$ and excursioning from $V_{DD}/2$ to $3 V_{DD}/2$. Note also, as shown in FIG. 4A, the series-coupled transistors M1 and M2 (and M3 and M4) (via the center tap of output transformer 215) may receive input signals that are in phase, although at the different common mode voltage levels.

Thus the coupling of the gain stages enables the "loss-less" conversion of the regulator supply voltage Vreg (i.e., $V_{DD}$) to Vreg/2 (i.e., $V_{DD}/2$) by coupling two of these circuits such that the current generated is re-used (rather than being dissipated) and further, the correct voltage for the two stages can be achieved: In other words, the need for a LDO or other regulator to take a supply voltage and dissipate it down to the $V_{DD}/2$ level can be avoided. Or, effectively, gain stage 220 acts as a LDO regulator or DC-DC converter for gain stage 210. Thus the supply current (Isupp) provided to gain stage 220 not only powers that stage, but is also re-used (Isupp) in gain stage 210 to power that stage as well.

In this way, the same power may be delivered to the load for both a CMOS output stage configuration and an NMOS stage configuration. Specifically, with regard to FIG. 1, the output power of CMOS output stage 10 may correspond to:

$$P_{TOT}=(V_{DD}/\sqrt{(2)})^2/R_L. \quad [\text{Eq. 1}]$$

In turn, the output power enabled by the two separate NMOS stages of output gain stage 200 of FIG. 4A may be as follows:

$$P_{TOT}=(V_{DD}/\sqrt{(2)})^2/2R_L(V_{DD}/\sqrt{(2)})^2/2R_L \quad [\text{Eq. 2}]$$

$$\text{Therefore } P_{TOT}=(V_{DD}/2)^2/R_L. \quad [\text{Eq. 3}],$$

which is the same as in [Eq. 1]

As described above, improved linearity of capacitance values can be realized by implementing an all NMOS output gain stage. Such linearity may further be improved by providing capacitance compensation at an input to the output gain stage. For example, the rapid dc/dv transition (or slope of the MOS input capacitance versus voltage) can be reduced further with voltage-shifted versions of capacitance compensation. Thus as shown in FIG. 4A, the gate terminal of each of NMOS devices M1-M4 may include a capacitance compensation circuit 245. Details of such capacitance compensation is described more fully in co-pending U.S. patent application Ser. No. 12/080,066, commonly assigned herewith, the disclosure of which is hereby incorporated by reference. In one particular implementation, compensation circuit 245 may be implemented using a PMOS device coupled between a bias voltage $V_{bci}$ and the gate terminal (e.g., implemented as a gate capacitor having source and drain terminals coupled to the bias voltage and its gate terminal coupled to the gate terminal of the corresponding NMOS device), although other implementations are possible. Using such a compensation structure, improved linearity may result.

Figure 4B:
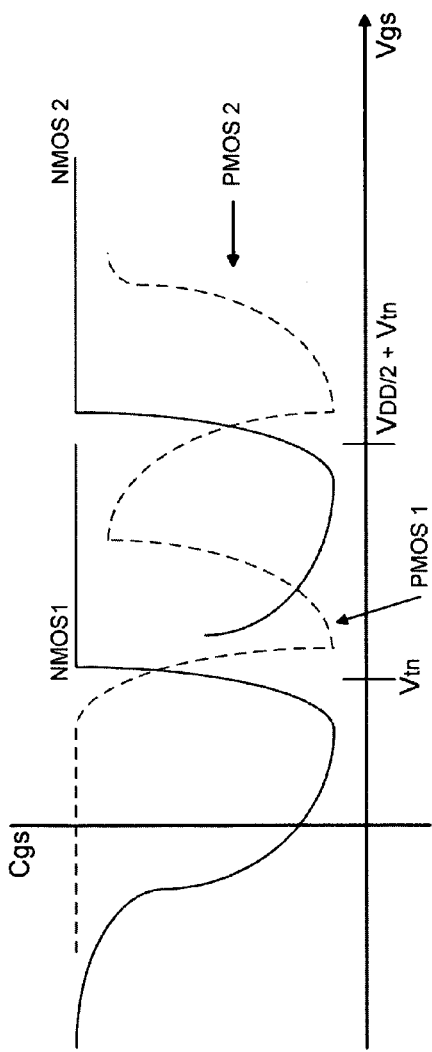
FIGS. 4B and 4C are graphical illustrations of capacitance of NMOS devices in accordance with one embodiment of the present invention.
Figure 4C:
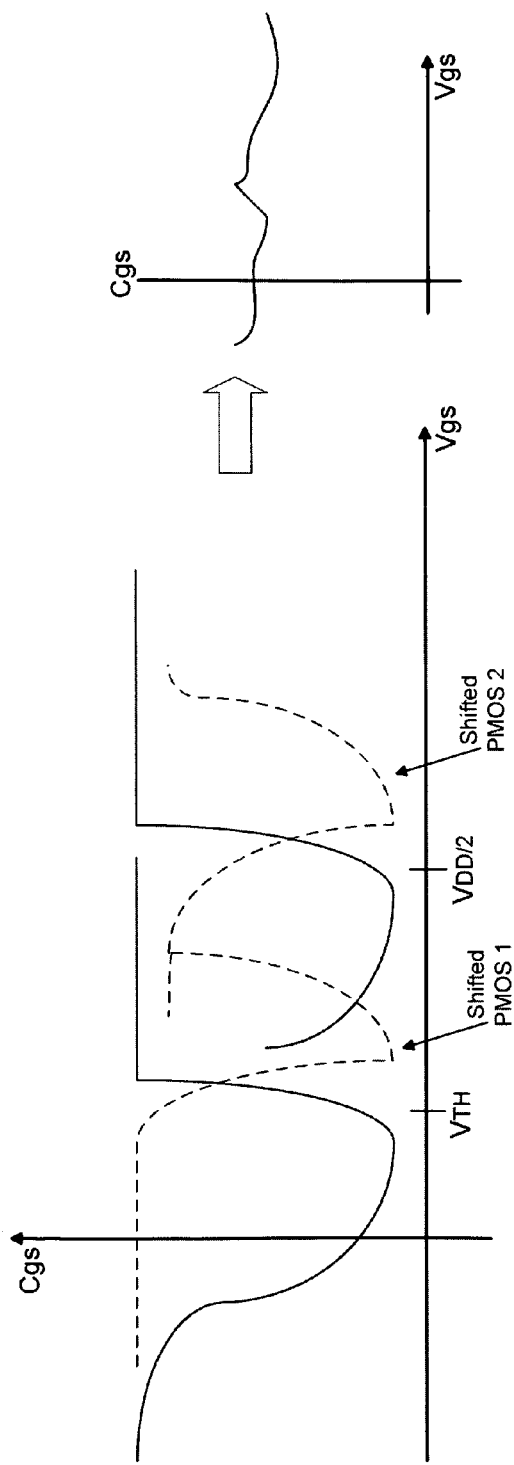

Referring now to FIG. 4B, shown is a graphical illustration of a capacitance of the NMOS devices (e.g., M1 and M2) as a function of gate voltage (specifically, $C_{gs}$ is the vertical axis and $V_{gs}$ is the horizontal axis). As seen, capacitance varies substantially at around a threshold voltage ($V_{th}$). Accordingly, to compensate for such non-linearity, the capacitance compensation circuits may be provided, as reflected in the dashed lines in FIG. 4B. Note the different common mode voltages at which MOSFETs M1 and M2 operate result in the different voltage levels at which the substantial non-linearity occurs. In an alternate implementation, the compensation effects of the compensation circuits can be shifted as shown in FIG. 4C to further smooth the non-linearities, as shown in FIG. 4C. In one embodiment, shifting of the compensation components can be realized by applying different bias voltages to one or more of the compensation circuits. While shown with this particular implementation in the embodiment of FIGS. 4A-4C, understand that in some implementations, such compensation circuits may not be present.

In some implementations, the number of gain cells that are stacked can be increased to divide the voltage. If such additional gain cells are added, they will be coupled to lower voltages, and resulting larger impedance transformations are needed. In this way, due to the further lower voltages swings, even the use of a thin oxide NMOS transistor can be realized, with much higher $f_t$ that would considerably ease the implementation of the output network. This would however, be at a cost of a larger transformation ratio.

As one example, if there are N stages provided, each stage has Vdd/N voltage across it. Each NMOS transistor sees 2×Vdd/N across it as a maximum voltage excursion. For Vdd=3.6 v (max) and N=3=Vmax/NMOS=2.4 v. This is almost sustainable by the 0.18 um (thin oxide) NMOS, and is definitely sustainable by the 0.25 um (thin oxide), thus enabling use of an even higher $f_t$ NMOS device (e.g., a 0.25 um or even a 0.18 um thin oxide transistor). Depending on the choice of CMOS technology node for the PA implementation, one may choose the appropriate N (number of stages) to enable the use of higher ft thin-oxide NMOS transistors without imposing any high-voltage stress.

A flexible implementation may include multiple gain stages (e.g., three or more), with at least one stage having different types of NMOS transistors to enable use of higher $f_t$ devices where possible. For example, the lower voltage stage (s) (i.e., a first stage directly coupled to a ground node, and one or more stages stacked thereon) can have lower voltage thin oxide devices, and the upper stage(s) can have higher voltage thick oxide devices.

Figure 5:
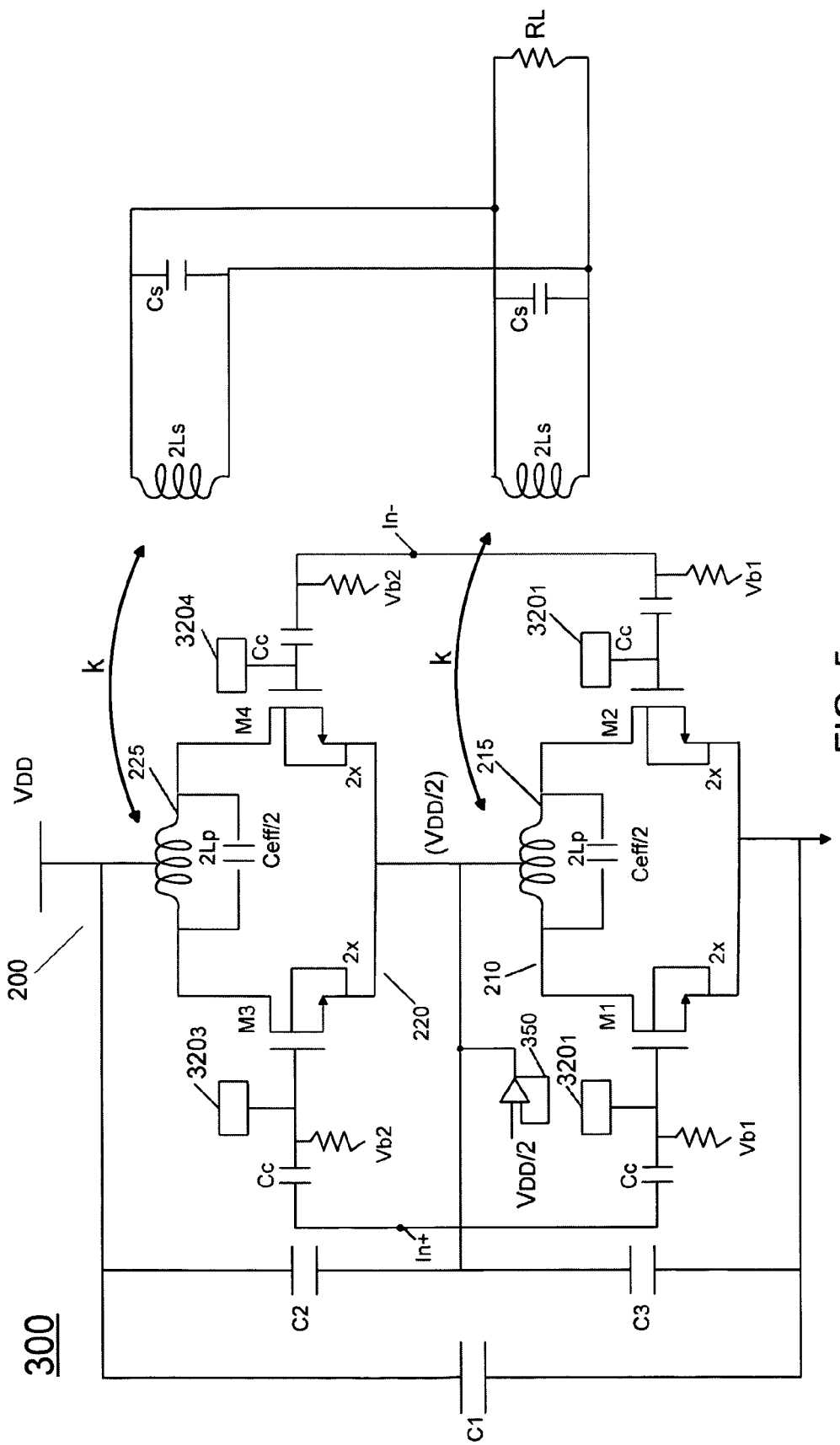
FIG. 5 is a schematic diagram of an output stage topology for a power amplifier in accordance with an embodiment of the present invention.

To realize a complete output stage for a PA, embodiments may include further components. Referring now to FIG. 5, shown is a schematic diagram of an output stage topology for a PA in accordance with an embodiment of the present invention. As shown in FIG. 5, output stage 300 includes an output stage portion 200, which may correspond to that shown in FIG. 4. To provide the output power to an attached load $R_L$, the primary coils (2Lp) of output transformers 215 and 225 may be coupled to secondary coils (2L$_S$). As shown, the secondary coils may be coupled to the primary coils according to a coupling coefficient of k. The turns ratio between primary and secondary coils may provide for an impedance transformation. Note further that capacitors $C_s$ may be coupled in parallel as shown in FIG. 5. It is also to be noted that the secondary coils can be connected in a series configuration as well (instead of a parallel connection). Also, the individual Cs, may be lumped into a single capacitor. For example, the two secondary coils shown in FIG. 5 may be coupled in series, with $R_L$ coupled in parallel across the two secondary coils. In yet other implementations, instead of individual $C_S$ capacitors, a single $C_S$ may be coupled in parallel with $R_L$. Still further implementations are also possible.

FIG. 5 further shows the input signals provided to gain stage 200. Specifically, a differential signal including a positive portion IN+ and a negative portion IN− is coupled to the corresponding gate terminals through a DC block formed of capacitors $C_C$ to thus couple the incoming AC signal to the corresponding gate terminal of the NMOS devices. While shown as a simple capacitance block, different coupling approaches can be used in various implementations—notably that of coupling approaches which employ transformers at the input as well.

In addition, note that the two gain stages, namely gain stages 210 and 220, may be at different common mode voltages, as set up by bias voltages $V_{b1}$ and $V_{b2}$, respectively. Vb1 and Vb2 may be approximately different by Vdd/2 to correspond to the difference in the source reference voltages. In addition, in the implementation shown in FIG. 5 a linearization circuit $320_1$-$320_4$ may be provided for each corresponding NMOS device. These linearization circuits may provide for improved linearity over an input voltage range, to accommodate for varying capacitance associated with the NMOS devices at different signal values. In one embodiment, each linearization circuit 320 may be formed of a corresponding gate capacitor or MOS capacitor, formed of a PMOS transistor having source and drain terminals coupled together to act as a plate of the capacitor. While not shown, understand that a different bias source may be coupled to the linearization circuits to provide a bias voltage to the commonly coupled source and drain terminals. In turn, the gate terminal of the PMOS device of each linearization circuit 320 may be coupled to the corresponding gate terminal of the given NMOSs M1-M4. The corresponding PMOS device of linearization circuits 320 may be of relatively small relative value (e.g., 0.2×–0.8× of the main gain device).

In addition, supply decoupling capacitors may be coupled between supply voltage $V_{DD}$ and ground. Specifically, a first capacitor $C_1$ may be coupled between the supply voltage and ground, and a pair of second decoupling capacitors $C_2$ and $C_3$ may be coupled between the supply voltage node and the $V_{DD}/2$ node, and this intermediate supply voltage node and the ground node, respectively. Note that the supply decoupling capacitors may be laid out in a given implementation to reduce the traces such that partial inductances in the loops may be minimized. In some implementations, the supply decoupling capacitors may be formed of thin oxide MOS transistors. Other implementation possibilities are metal-oxide-metal (MOM) (or finger capacitors) in combination with thick-oxide NMOS transistors. For example, C1 may be implemented with a finger capacitance in parallel on top of a thick oxide MOS capacitor, and C2 and C3 may be implemented using thin oxide MOM capacitors to enable higher capacitance density. In addition, for C2 and C3, MOM capacitors may be connected in parallel, like in C1. Still further, a buffer 350 may be coupled to the intermediate supply voltage node to provide for maintenance of the correct voltage at this node. As shown, buffer 350 is coupled to receive the intermediate voltage of $V_{DD}/2$ at a first input and a feedback input from the output of buffer 350. It is, however, expected that the 2 gain stages 210 and 220 would self-regulate the intermediate supply voltage to Vdd/2. The buffer 350 would only be required to provide the minimal correction to compensate for small mismatch induced errors.

Figure 6:
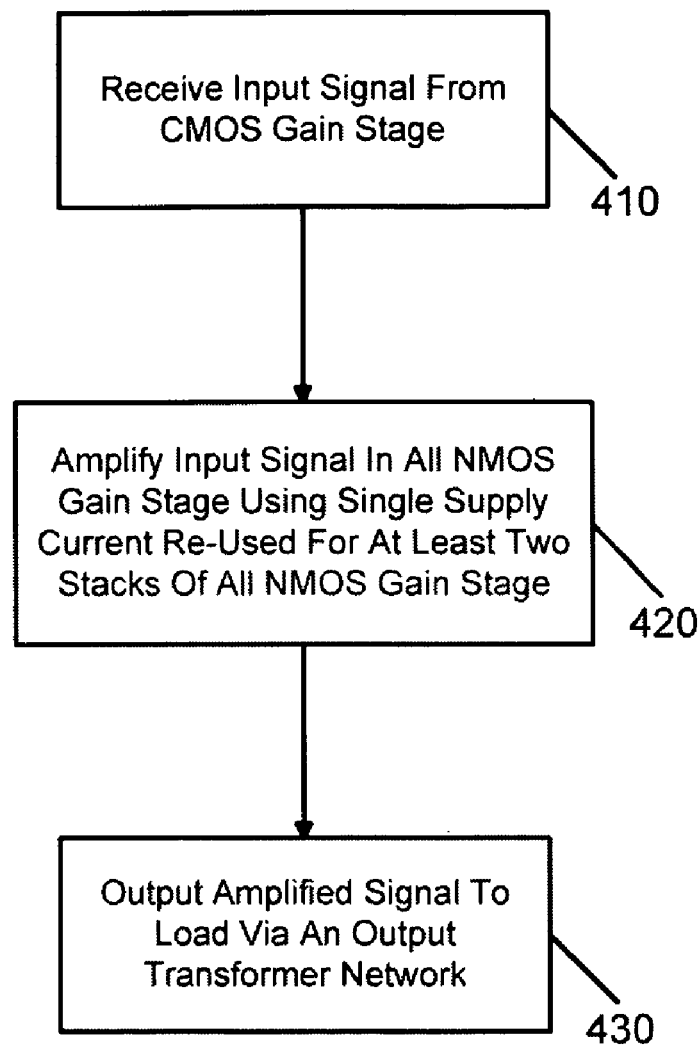
FIG. 6 is a flow diagram of a method of operation in accordance with one embodiment of the present invention.

Referring now to FIG. 6, shown is a flow diagram of a method of operation in accordance with one embodiment of the present invention. As shown in FIG. 6, method 400 may be used to operate a CMOS power amplifier having at least one gain stage with all-NMOS devices. As shown in FIG. 6, method 400 may begin by receiving an input signal from a CMOS gain stage (block 410). For example, a differential input signal may be received in the all-NMOS stage from a front end or intermediate gain stage.

Next, the input signal may be amplified in the all-NMOS gain stage (block 420). More specifically, a single supply current, which may be received from an on-chip regulator such as an LDO regulator, may be used to power multiple gain stages formed of only NMOS devices, connected in "series" with regard to a series-flowing supply current. For example, with reference back to FIG. 5, the two gain stages 210 and 220 may be powered using a single supply current that is provided to first stage 220 and is then re-used in second stage 210 to thus power both gain-stages without lossy power-dissipation.

An amplified signal generated in these series configuration of gain stages with regard to use of a supply current may be output to a load via an output transformer network (block 430). For example, the output transformers of FIG. 5 may be coupled to the drain terminals of the corresponding NMOS transistors to thus output the amplified signal to the load. While shown with this particular implementation in the embodiment of FIG. 6, the scope of the present invention is not limited in this regard.

Figure 7:
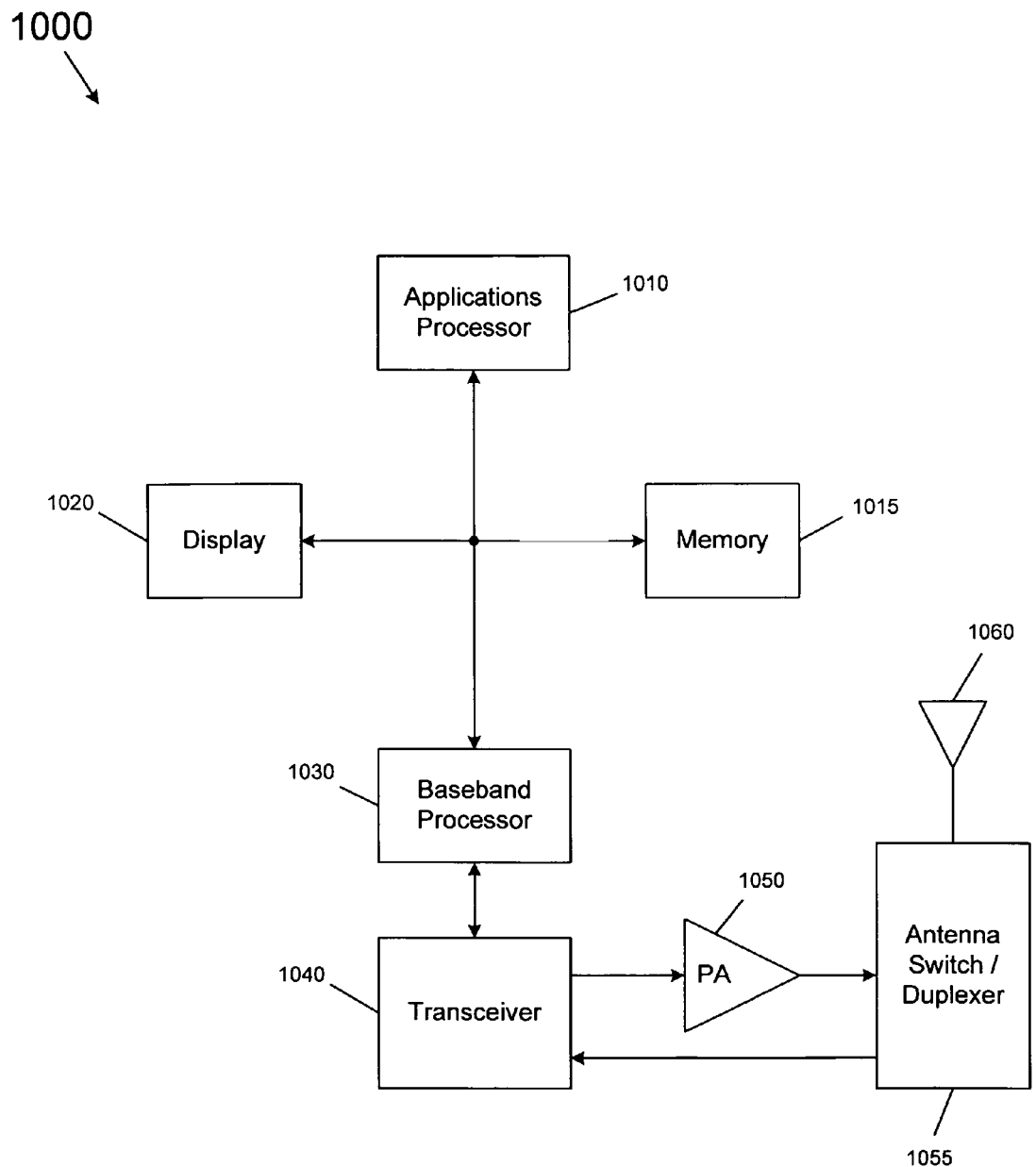
FIG. 7 is a block diagram of a wireless device in accordance with an embodiment of the present invention.

As described above, an all-NMOS output gain stage can be implemented in a CMOS PA. Such a device can be used in various wireless systems, including handsets, mobile devices, PDAs and so forth. Referring now to FIG. 7, shown is a block diagram of a wireless device 1000 in accordance with an embodiment of the present invention. As shown in FIG. 7, wireless device 1000 may include an applications processor 1010 which may be a microprocessor or other programmable logic to handle various system features, such as running application programs desired by a user. To perform its functions, applications processor 1010 may communicate with a memory 1015, which may be a flash memory or other non-volatile memory. Applications processor 1010 may further communicate with a display 1020, such as an LCD display of the system. For handling RF communications, e.g., wireless phone calls, wireless data transmissions and so forth, e.g., according to a communications protocol such as GSM/EDGE, W-CDMA, or LTE, applications processor 1010 may communicate with a baseband processor 1030, which may handle baseband operations both for transmit and receive paths. In turn, baseband processor 1030 is coupled to a transceiver 1040, which may receive incoming baseband signals from baseband processor 1030, and perform processing to upconvert the signals to RF levels for transmission to a PA 1050. PA 1050 may be a power amplifier in accordance with an embodiment of the present invention that includes multiple gain stages, including a final output stage that that is formed of only NMOS transistors. In some embodiments, control information from baseband processor 1030 may be coupled through transceiver 1040 to PA 1050. In turn, PA 1050 may be coupled to an antenna switch, duplexer or both 1055 which in turn is coupled to an antenna 1060, which radiates the amplified RF signal.

In various embodiments, baseband processor 1030 may send varying control information to PA 1050 to enable it to operate at different power levels, based upon a desired output power level as dictated by different communication schemes. In this way, baseband processor 1030 may perform transmit power control. To do so, in various implementations baseband processor 1030 may send control information to control a number of output gain stages to be enabled to output RF signals at a selected power level.

As further shown in FIG. 7, in a receive path, antenna 1060 couples through antenna switch 1055 and possibly through the duplexer or SAW filters and then to transceiver 1040, which may demodulate the incoming RF signals back to baseband for transmission to baseband processor 1030 for further processing. While shown with this particular implementation in the embodiment of FIG. 7, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first differential gain stage to receive a differential input signal at a first common mode voltage and to amplify the differential input signal to a first differential amplified output signal, the first differential gain stage including a first pair of linear NMOS gain transistors having drain terminals coupled to a primary coil of a first output transformer and commonly coupled source terminals; and
a second differential gain stage to receive the differential input signal at a second common mode voltage and to amplify the differential input signal to a second differential amplified output signal, the second differential gain stage including a second pair of linear NMOS gain transistors having drain terminals coupled to a primary coil of a second output transformer and commonly coupled source terminals coupled to a center tap of the primary coil of the first output transformer, wherein a supply current provided to the second differential gain stage is re-used for the first differential gain stage.

2. The apparatus of claim 1, wherein the center tap is to have a voltage corresponding to half of a supply voltage, and a center tap of the second output transformer is to have a voltage corresponding to the supply voltage.

3. The apparatus of claim 2, wherein the commonly coupled source terminals of the second pair of linear NMOS gain transistors are coupled to the center tap of the primary coil of the first output transformer at a node corresponding to a virtual ground.

4. The apparatus of claim 1, wherein the first and second pairs of linear NMOS gain transistors are of a substantially common size.

5. The apparatus of claim 1, wherein the apparatus comprises a power amplifier including an output stage with the first and second differential gain stages, and having a smaller area and a reduced input and output stage capacitance compared to a CMOS output stage that provides the same output power.

6. A power amplifier comprising:
an output gain stage including at least first and second linear NMOS gain transistors differentially driven at corresponding gate terminals by a differential input signal, the first and second linear NMOS gain transistors having corresponding drain terminals coupled to a first output transformer to output a selected power level to a load coupled to the first output transformer, wherein the output gain stage has a substantially smaller capacitance than a CMOS output gain stage including at least one PMOS transistor and configured to output the selected power level.

7. The power amplifier of claim 6, wherein the output gain stage device does not include any PMOS transistors.

8. The power amplifier of claim 7, wherein the all linear NMOS gain transistor output gain stage is part of a CMOS power amplifier.

9. The power amplifier of claim 6, wherein the at least one PMOS transistor is substantially larger than a linear NMOS gain transistor of the first and second linear NMOS gain transistors to generate a substantially equal transductance.

10. The power amplifier of claim 6, further comprising a linearization circuit coupled to the corresponding gate terminals of the first and second linear NMOS gain transistors to compensate for a capacitance change of the output gain stage as a result of different levels of the differential input signal.

11. A method comprising:
receiving an input signal from a gain stage of a power amplifier formed using a complementary metal oxide semiconductor (CMOS) process;
amplifying the input signal in an all-NMOS gain stage of the power amplifier using a single supply current re-used for at least a first gain stage portion and a second gain stage portion of the all-NMOS gain stage connected in a series configuration with regard to the single supply current, the first gain stage portion including a first linear NMOS gain device and the second gain stage portion including a second linear NMOS gain device; and
outputting the amplified signal to a load via an output transformer network of the power amplifier.

12. The method of claim 11, further comprising biasing the first gain stage portion at a first common mode voltage and biasing the second gain stage portion at a second common mode voltage, wherein the first gain stage portion is coupled between a supply voltage node and an intermediate supply voltage node and the second gain stage portion is coupled between the intermediate supply voltage node and a reference voltage node.

13. The method of claim 12, further comprising receiving the single supply current by coupling the supply voltage node to a center tap of a first output transformer of the first gain stage portion and coupling source terminals of the first gain stage portion to a center tap of a second output transformer of the second gain stage portion.

14. The method of claim 13, further comprising linearizing a capacitance of the all-NMOS gain stage over a range of values of the input signal, the input signal received from the gain stage formed of NMOS and PMOS devices.

15. An apparatus comprising:
a first NMOS output gain stage to receive a differential input signal at a first common mode voltage and to output a first differential output signal;
a first transformer having a first coil to receive the first differential output signal and a second, coil to output the first differential output signal to an output load, the first transformer having a center tap coupled to receive a supply current at a supply voltage node;
a second NMOS output gain stage to receive the differential input signal at a second common mode voltage and to output a second differential output signal; and
a second transformer having a first coil to receive the second differential output signal and a second coil to output the second differential output signal to the output load, the first coil of the second transformer having a center tap coupled to receive a first intermediate supply current re-used from the supply current at a first intermediate supply voltage node.

16. The apparatus of claim 15, wherein the first NMOS output gain stage includes first and second NMOS transistors having commonly coupled source terminals coupled to the first intermediate supply voltage node.

17. The apparatus of claim 15, further comprising a supply decoupling capacitor network coupled between the supply voltage node and a reference node coupled to the second NMOS output gain stage.

18. The apparatus of claim 17, wherein the supply decoupling capacitor network is formed of a plurality of thin oxide metal oxide semiconductor transistors and at least one finger capacitor coupled in parallel therewith.

19. The apparatus of claim 15, further comprising an input buffer coupled to the first intermediate supply voltage node to help maintain a predetermined voltage level at the first intermediate supply voltage node.

20. The apparatus of claim 15, further comprising:
a third NMOS output stage coupled to receive the differential input signal at a third common mode voltage and to output a third differential output signal; and
a third transformer having a first coil to receive the third differential output signal and a second coil to output the third differential output signal to the output load, the third transformer having a center tap coupled to receive a second intermediate supply current re-used from the re-used supply current via commonly coupled source terminals of an NMOS transistor pair of the second NMOS output gain stage.

21. The apparatus of claim 20, wherein at least the third NMOS output stage is formed of a lower voltage NMOS transistor having a higher unity-current-gain frequency ($f_t$) than a higher voltage NMOS transistor of the first NMOS output gain stage having a lower $f_t$.

22. A wireless device comprising:
a transceiver to receive baseband signal information from a baseband processor and to output a radio frequency (RF) signal;
a power amplifier coupled to the transceiver to receive and amplify the RF signal, the power amplifier including a complementary metal oxide semiconductor (CMOS) gain stage to receive and amplify the RF signal and a second gain stage coupled to the CMOS gain stage to receive and further amplify the amplified RF signal, the second gain stage including a first transistor of a first polarity, the first transistor having an output terminal coupled to a first coil of a first output transformer and a source terminal coupled to a first coil of a second output transformer, and a second transistor of the first polarity, the second transistor having an output terminal coupled to the first coil of the second output transformer and a source terminal coupled to a reference voltage, the first and second transistors driven at a corresponding gate terminal by the amplified RF signal at different common mode voltages and at a common phase; and
an antenna coupled to the power amplifier to radiate the amplified RF signal.

23. The wireless device of claim 21, wherein the first and second transistors are of a substantially common size.

24. The wireless device of claim 21, wherein the second gain stage is to generate an equivalent power output to a load as a CMOS output gain stage of a power amplifier having one transistor substantially sized as the first transistor of the first polarity and a second transistor of a second polarity, the second transistor substantially larger than the one transistor.

25. The wireless device of claim 21, wherein the source terminal of the first transistor is coupled to a center tap of the first coil of the second output transformer and the first coil of the first output transformer has a center tap to couple to a supply voltage.

* * * * *